United States Patent
Kim et al.

(10) Patent No.: US 11,791,579 B2
(45) Date of Patent: Oct. 17, 2023

(54) ELECTRONIC DEVICE INCLUDING HOST CONNECTOR AND MEMORY DEVICE

(71) Applicant: SAMSUNG ELECTRONICS CO., LTD., Suwon-si (KR)

(72) Inventors: Kyung-Suk Kim, Seongnam-si (KR); Chung Hyun Ryu, Hwaseong-si (KR); So-Young Jung, Seongnam-si (KR); Ji Yong Kim, Suwon-si (KR); Jin Wook Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 134 days.

(21) Appl. No.: 17/392,763

(22) Filed: Aug. 3, 2021

(65) Prior Publication Data
US 2022/0115800 A1 Apr. 14, 2022

(30) Foreign Application Priority Data
Oct. 8, 2020 (KR) .................. 10-2020-0130108

(51) Int. Cl.
*H01R 12/72* (2011.01)
*H01R 13/26* (2006.01)
(Continued)

(52) U.S. Cl.
CPC ......... *H01R 12/721* (2013.01); *H01R 13/26* (2013.01); *H05K 1/117* (2013.01); *H01R 12/73* (2013.01);
(Continued)

(58) Field of Classification Search
CPC ...... H01R 12/721; H01R 12/73; H01R 13/26; H01R 13/03; H05K 1/117; H05K 2201/09909
(Continued)

(56) References Cited

U.S. PATENT DOCUMENTS 3,140,907 A * 7/1964 Davies ............... H01R 13/26 439/59
7,094,086 B2 * 8/2006 Teicher ............... H01R 31/065 439/954
(Continued)

FOREIGN PATENT DOCUMENTS

CN 207611898 U * 7/2018
CN 207677139 U * 7/2018
(Continued)

OTHER PUBLICATIONS

Communication dated Feb. 23, 2022 by the European Patent Office for European Patent Application No. 21197068.6.
(Continued)

*Primary Examiner* — Peter G Leigh
(74) *Attorney, Agent, or Firm* — Sughrue Mion, PLLC

(57) ABSTRACT

A electronic device including a host connector and memory device is provided. The host connector includes a connector pin, and the memory connector includes a connection terminal electrically connected to the connector pin of the host connector. The connector pin includes a first conductor part including a conductor, a second conductor part including the conductor, the second conductor part being bent from the first conductor part in a direction towards the connection terminal, and a stub including an insulator, the stub being bent from the second conductor part in a direction away from the connection terminal. The connection terminal includes a first region including an insulator, and a second region including a conductor. The second conductor part is electrically connected to the second region, so that the host connector is electrically connected to the memory connector.

18 Claims, 25 Drawing Sheets

(51) Int. Cl.
*H05K 1/11* (2006.01)
*H01R 12/73* (2011.01)
*H01R 13/03* (2006.01)

(52) U.S. Cl.
CPC .... *H01R 13/03* (2013.01); *H05K 2201/09909* (2013.01)

(58) Field of Classification Search
USPC ........................................................ 439/76.1
See application file for complete search history.

(56) References Cited

U.S. PATENT DOCUMENTS

| | | | | |
|---|---|---|---|---|
| 7,160,125 B1* | 1/2007 | Teicher | .............. | H01R 13/6469 439/954 |
| 7,175,444 B2 | 2/2007 | Lang et al. | | |
| 7,303,438 B2 | 12/2007 | Dawiedczyk et al. | | |
| 7,363,947 B2* | 4/2008 | Teicher | .............. | H01R 13/6469 439/954 |
| 7,537,471 B2* | 5/2009 | Teicher | .................. | H01R 13/64 439/172 |
| 7,591,657 B2* | 9/2009 | Teicher | .............. | H01R 13/6469 439/954 |
| 8,398,442 B2* | 3/2013 | Yagi | ....................... | H01R 13/04 439/693 |
| 8,946,568 B2* | 2/2015 | Tan | ........................ | G06F 1/181 174/561 |
| 8,951,051 B2* | 2/2015 | Natter | .................... | H01R 13/04 439/135 |
| 9,077,094 B2 | 7/2015 | Minich | | |
| 9,142,926 B2* | 9/2015 | Tsai | ....................... | H01R 27/00 |
| 9,225,085 B2 | 12/2015 | Cartier, Jr. et al. | | |
| 9,257,778 B2 | 2/2016 | Buck et al. | | |
| 9,531,130 B1 | 12/2016 | Phillips et al. | | |
| 9,560,760 B2 | 1/2017 | Wig | | |
| 10,249,989 B2 | 4/2019 | Luk et al. | | |
| 10,326,244 B2 | 6/2019 | Trout et al. | | |
| 10,411,379 B2* | 9/2019 | Wagman | ................... | C22C 9/04 |
| 10,594,085 B2 | 3/2020 | Trout et al. | | |
| 2003/0171035 A1* | 9/2003 | Yoo | ..................... | H01R 12/721 439/638 |
| 2008/0274633 A1* | 11/2008 | Teicher | .............. | H01R 13/6591 439/173 |
| 2008/0299833 A1* | 12/2008 | Abe | ..................... | H01R 13/642 439/660 |
| 2011/0003493 A1 | 1/2011 | Mo et al. | | |
| 2020/0006880 A1 | 1/2020 | Esmaeili et al. | | |

FOREIGN PATENT DOCUMENTS

| | | | | |
|---|---|---|---|---|
| CN | 109787008 A | * | 5/2019 | |
| DE | 10 2014 210269 A1 | | 12/2015 | |
| DE | 102014210269 A1 | * | 12/2015 | ............ H01R 13/03 |
| DE | 20 2017 001425 U1 | | 8/2017 | |
| WO | WO-2018042793 A1 | * | 3/2018 | ........... H01R 12/774 |

OTHER PUBLICATIONS

Communication dated Mar. 7, 2022 by the European Patent Office for European Patent Application No. 21197068.6.

* cited by examiner

220

US 11,791,579 B2

ELECTRONIC DEVICE INCLUDING HOST CONNECTOR AND MEMORY DEVICE

CROSS-REFERENCE TO RELATED APPLICATION

This application claims priority under 35 U.S.C. 119 from Korean Patent Application No. 10-2020-0130108 filed on Oct. 8, 2020 in the Korean Intellectual Property Office the contents of which are herein incorporated by reference in its entirety.

BACKGROUND

1. Technical Field

The present disclosure relates to an electronic device including a host connector and a memory device.

2. Description of the Related Art

A memory device represented by a solid state drive (SSD) is widely used not only in traditional electronic devices such as desktop personal computers (PCs), tablet PCs, or laptop PCs, but also electronic devices, such as automobiles, drones, or aircraft, related to mobility. The electronic devices may be exposed to various environments.

SUMMARY

It is an aspect to provide a host connector with improved signal integrity (SI) performance.

It is also an aspect to provide a memory device with improved SI performance.

It is also an aspect to provide an electronic device with improved SI performance.

According to an aspect of one or more embodiments, there is provided a host connector comprising a connector hole configured to accommodate a memory connector in which a connection terminal of a memory device is disposed; and a connector pin disposed in the connector hole, and electrically connected to the connection terminal of the memory connector when the memory connector is accommodated into the connector hole, wherein the connector pin includes a first conductor part including a conductor; a second conductor part including the conductor, the second conductor part being bent from the first conductor part in a direction towards the connection terminal of the accommodated memory connector; and a stub including an insulator, the stub being bent from the second conductor part in a direction away from the connection terminal of the accommodated memory connector.

According to another aspect of one or more embodiments, there is provided a memory device comprising a memory module including a module board and a memory connector disposed on one side of the module board, the memory connector having a connection terminal configured to be electrically connected to a host connector; a first enclosure disposed above the memory module; and a second enclosure disposed under the memory module, wherein the connection terminal includes a first region including an insulator; and a second region including a conductor, and wherein when the memory connector is electrically connected to the host connector, the first region is adjacent to the host connector as compared to the second region.

According to yet another aspect of one or more embodiments, there is provided an electronic device comprising a host connector including a connector pin; and a memory connector including a connection terminal electrically connected to the connector pin of the host connector, wherein the connector pin includes a first conductor part including a conductor; a second conductor part including the conductor, the second conductor part being bent from the first conductor part in a direction towards the connection terminal; and a stub including an insulator, the stub being bent from the second conductor part in a direction away from the connection terminal, and wherein the connection terminal includes a first region including an insulator; and a second region including a conductor, and wherein the second conductor part is electrically connected to the second region, so that the host connector is electrically connected to the memory connector.

BRIEF DESCRIPTION OF THE DRAWINGS

The above and other aspects will become more apparent by describing in detail exemplary embodiments thereof with reference to the attached drawings, in which.

DETAILED DESCRIPTION

Aspects of the present disclosure are not restricted to those set forth herein. The above and other aspects of the present disclosure will become more apparent to one of ordinary skill in the art to which the present disclosure pertains by referencing the detailed description of the present disclosure given below.

Hereinafter, various embodiments will be described with reference to the accompanying drawings.

Figure 1:
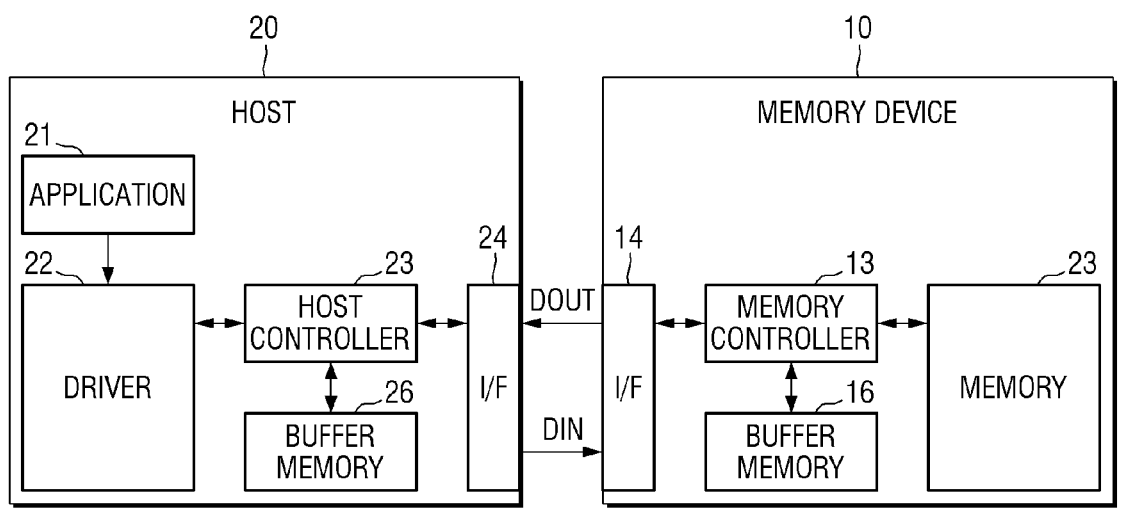
FIG. 1 is a block diagram of an electronic device according to some embodiments.

FIG. 1 is a block diagram of an electronic device according to some embodiments.

Referring to FIG. 1, a memory system includes a host 20 and a memory device 10. The host 20 and the memory device 10 may communicate through an interface. The interface may be predetermined. The interface may be, for example, universal flash storage (UFS), serial attached SCSI (SAS), serial advanced technology attachment (SATA), peripheral component interconnect express (PCIe), embedded multimedia card (eMMC), fibre channel (FC), advanced technology attachment (ATA), integrated drive electronics (IDE), universal serial bus (USB), Firewire (IEEE 1394), and the like, but embodiments are not limited thereto.

The host 20 controls the overall operation of the memory device 10. The host 20 may include an application 21, a driver 22, a host controller 23, a buffer memory 26, and a host interface (I/F) 24.

The application 21 may control the electronic device based on a set of commands that can be used in the electronic device. The application 21 may support, for example, a small computer system interface (SCSI) command set, but is not limited thereto.

The driver 22 may drive the memory device 10 connected to the host 20. Specifically, the driver 22 may receive a command for controlling the memory device 10 from the application 21, process the command using the host controller 23, and then provide the processed result to the application 21.

The application 21 and the driver 22 may be implemented as software or firmware, but embodiments are not limited thereto.

The host controller 23 controls the overall operation of the components of the host 20. For example, the host controller 23 may transmit data stored in the buffer memory 26 to the memory device 10 through the host interface 24 in response to a write command received from the driver 22. In addition, the host controller 23 may receive data from the memory device 10 through the host interface 24 in response to a read command received from the driver 22.

The buffer memory 26 may be used as a main memory of the host 20 and/or may be used as a cache memory or temporary memory for temporarily storing data. In addition, the buffer memory 26 may be used as a driving memory for driving software such as the application 21 or the driver 22. The buffer memory 26 may include, for example, a volatile memory including a dynamic random access memory (DRAM), but embodiments are not limited thereto.

The host interface (I/F) 24 may exchange data with a memory device interface (I/F) 14 of the memory device 10 through data lines DIN and DOUT. The data lines DIN and DOUT may be connected between the host 20 and the memory device 10 by a connection between a host connector and a memory device connector. The connection structure between the host connector and the memory device connector will be described later in detail.

The memory device 10 may include the memory device interface (I/F) 14, a memory controller 13, a buffer memory 16, and a memory 23. The memory device 10 may be connected to the host 20 through the memory device interface (I/F) 14.

The memory controller 13 may perform operations of writing, reading, or erasing data that is requested by the host 20 with respect to the memory 15.

A buffer memory 16 may be used to temporarily store data to be stored in the memory 15 or data read from the memory 15. The buffer memory 16 may include, for example, a volatile memory including a dynamic random access memory (DRAM), but embodiments are not limited thereto.

The memory 15 may include a nonvolatile memory such as a flash memory, a magnetoresistive random access memory (MRAM), a phase-change random access memory (PRAM), or a ferroelectric random access memory (Fe-RAM). In the following embodiments, the memory device 10 is described as a solid state drive (SSD) including a flash memory by way of example, but embodiments are not limited thereto.

The above-described memory system may be embedded in or installed in various electronic devices. The electronic device is a device including electronic equipment or an electronic component. For example, a desktop personal computer (PC), a tablet PC, a laptop PC, a netbook computer, a workstation, a server, a personal data assistant (PDA), a mobile phone, a smart phone, a video phone, an e-book reader, an MP3 player, a digital camera, a television, a projector, a game console, a navigation device, a robot, a global navigation satellite system (GNSS), as well as a medical device including electronic components, a washing machine, a refrigerator, and the like may correspond to the electronic device. In addition, an automobile, a drone, an aircraft, a ship, a satellite, and the like may also be referred to as the electronic device including electronic equipment or an electronic component.

Figure 2:
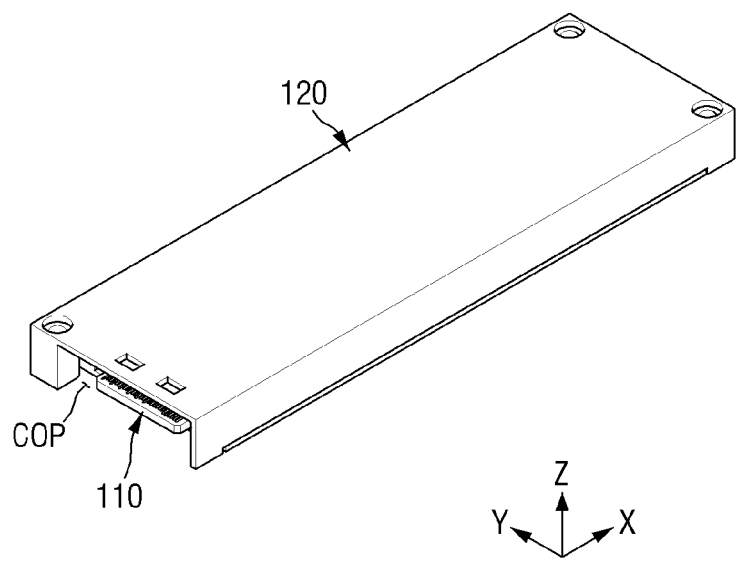
FIG. 2 is a perspective view of a memory device of an electronic device according to some embodiments.
Figure 3:
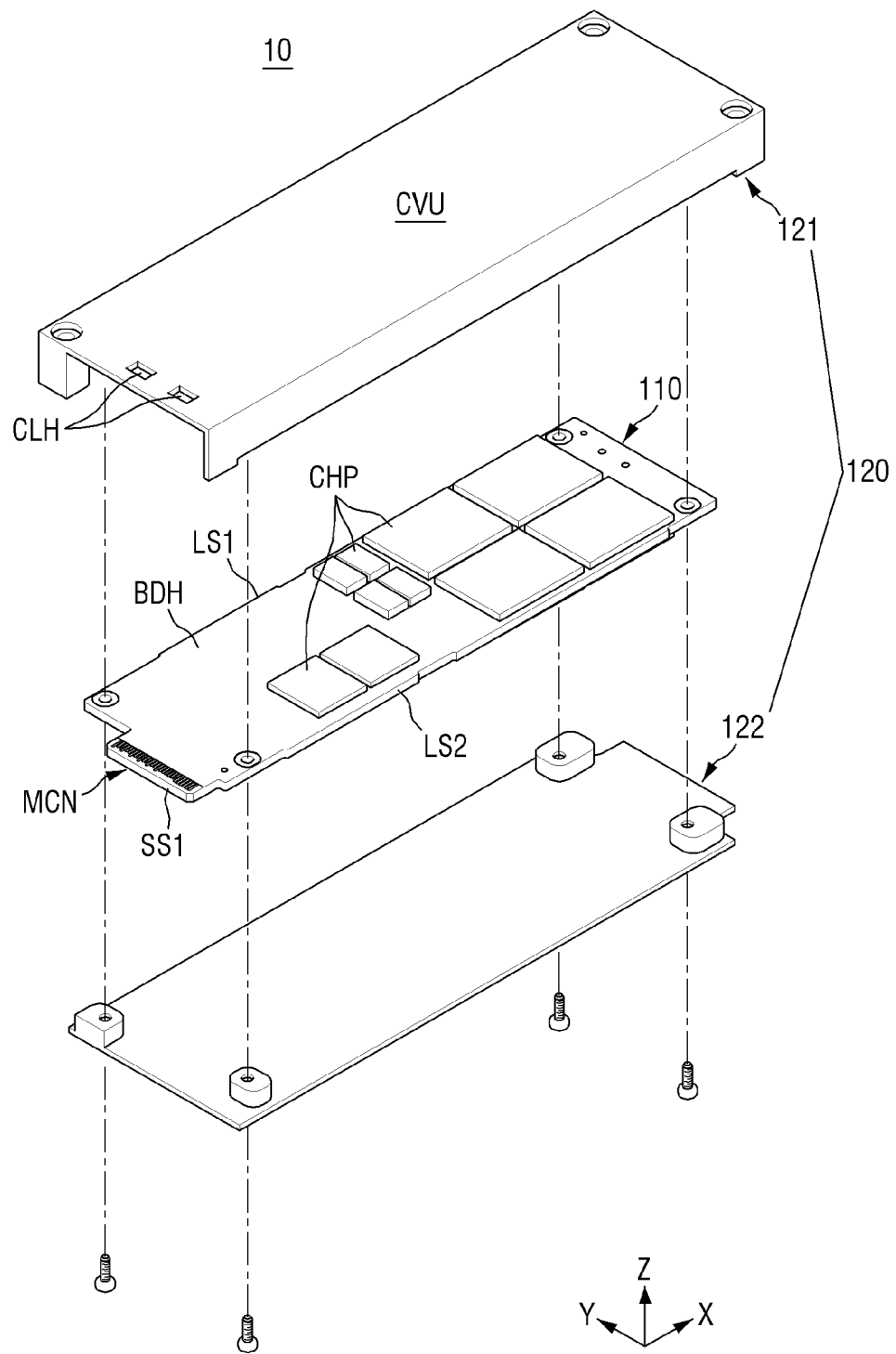
FIG. 3 is an exploded perspective view of the memory device illustrated in FIG. 2.
Figure 4:
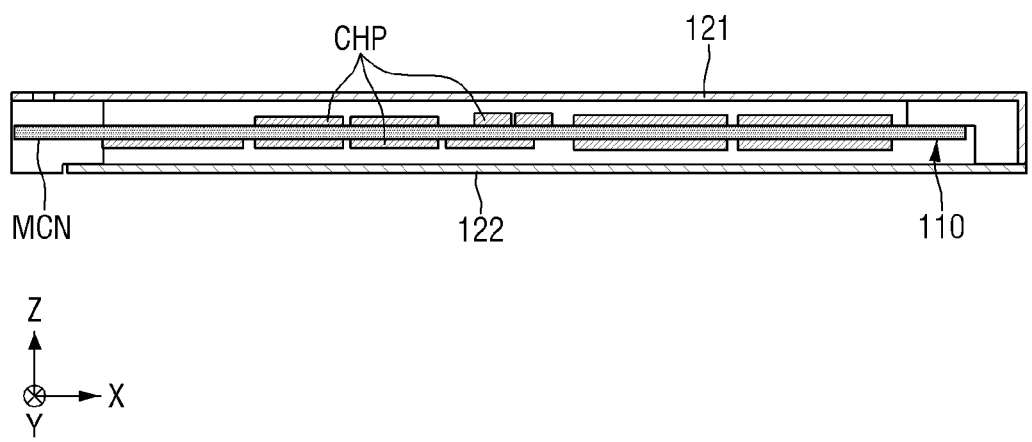
FIG. 4 is a cross-sectional view of the memory device of FIG. 2 taken along a first direction.
Figure 5:
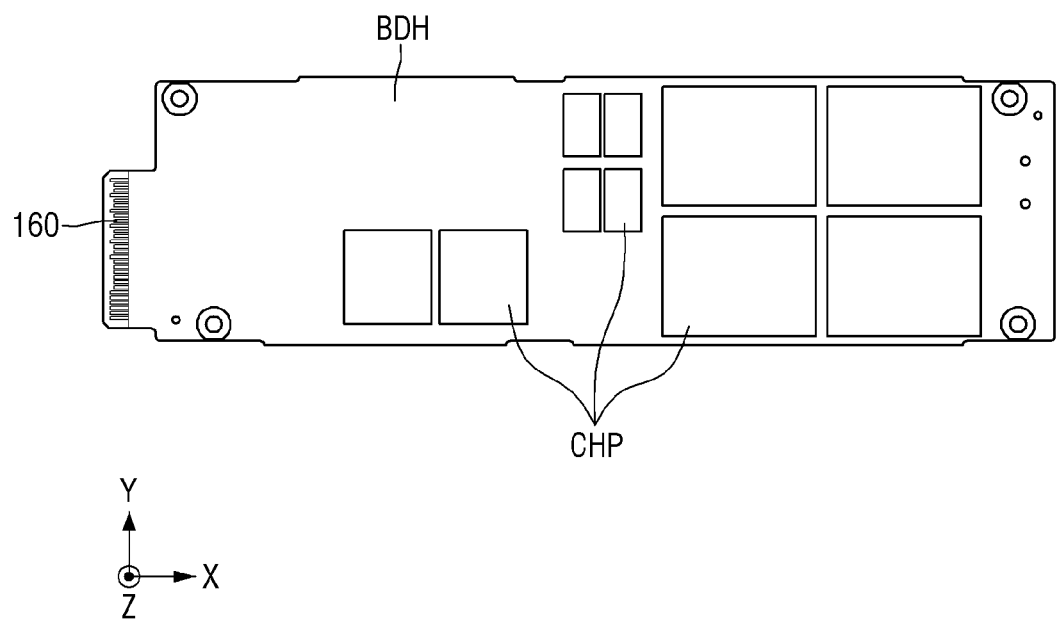
FIG. 5 is a plan view of a memory module included in the memory device of FIG. 2.
Figure 6:
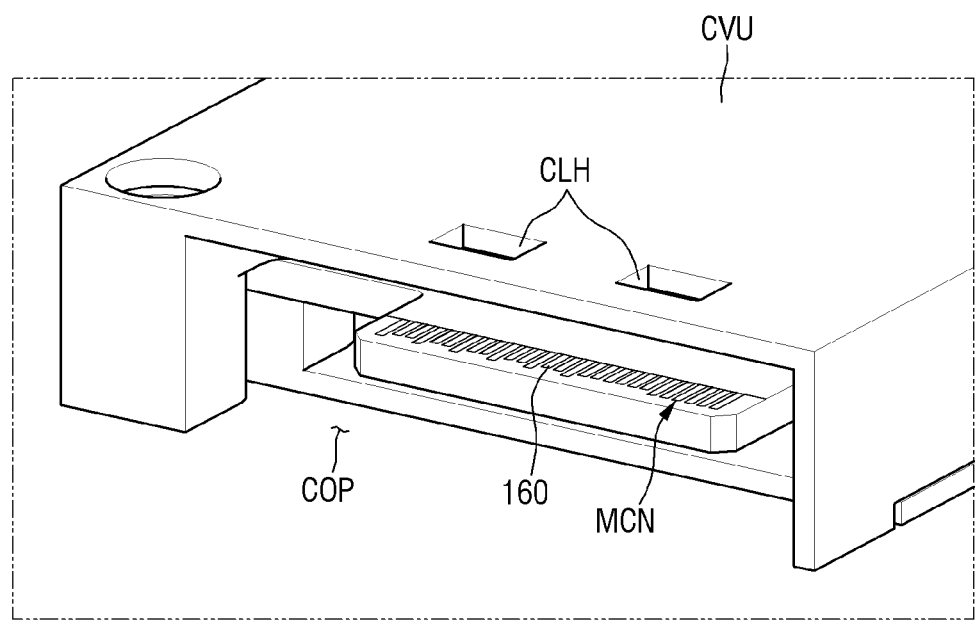
FIG. 6 is a partial perspective view of a memory connector of the memory device shown in FIG. 2.
Figure 7:
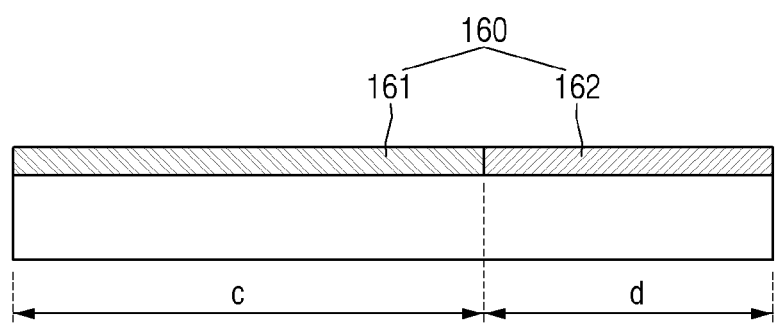
FIG. 7 is an enlarged view of a connection terminal of the memory connector of FIG. 6.
Figure 8:
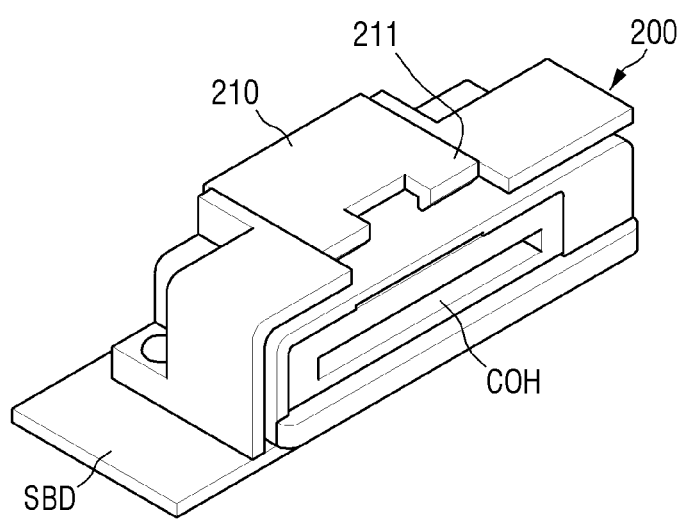
FIG. 8 is a perspective view of a host connector of a host of an electronic device according to some embodiments.
Figure 9:
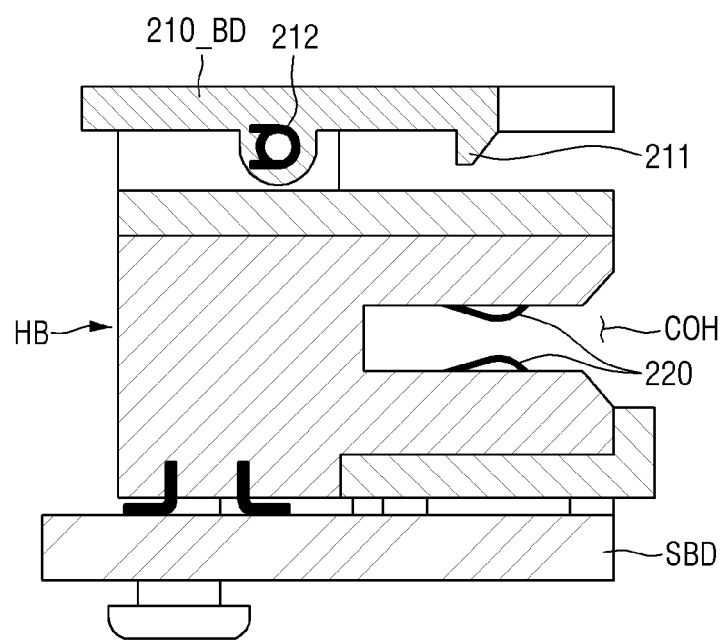
FIG. 9 is a cross-sectional view of the host connector of FIG. 8.
Figure 10:
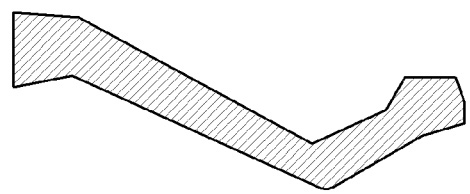
FIG. 10 is an enlarged view of a connector pin of the host connector of FIG. 9.

FIG. 2 is a perspective view of a memory device of an electronic device according to some embodiments. FIG. 3 is an exploded perspective view of the memory device illustrated in FIG. 2. FIG. 4 is a cross-sectional view of the memory device of FIG. 2 taken along a first direction. FIG. 5 is a plan view of a memory module included in the memory device of FIG. 2. FIG. 6 is a partial perspective view of a memory connector of the memory device shown in FIG. 2. FIG. 7 is an enlarged view of a connection terminal of FIG. 6. FIG. 8 is a perspective view of a host connector of a host of an electronic device according to some embodiments. FIG. 9 is a cross-sectional view of the host connector of FIG. 8. FIG. 10 is an enlarged view of a connector pin of the host connector of FIG. 9.

Referring to FIG. 2, the external appearance of the memory device 10 has a substantially rectangular parallelepiped shape. If a surface having the largest area in the rectangular parallelepiped is defined as a bottom surface, the bottom surface of the memory device 10 may have a rectangular shape.

In the drawings, the extension direction of the long side of the rectangular bottom surface is indicated as a first direction X, the extension direction of the short side thereof is indicated as a second direction Y, and the thickness direction of the rectangular parallelepiped is indicated as a third direction Z. Each plane defined by two directions may be referred to as an XY plane, a YZ plane, or a ZX plane. According to this convention, the bottom surface of the memory device 10 lies on the XY plane. Unless otherwise specified herein, the shape or appearance of a specific member in plan view denotes a shape in which the specific member lies in the XY plane.

The appearance of the memory device 10 may follow a standardized or arbitrary form factor. The dimensions of the rectangular parallelepiped memory device 10 may also be changed according to various standards.

Referring to FIGS. 2 to 10, the memory device 10 includes a memory module 110 and an enclosure assembly 120 accommodating the memory module 110. The enclosure assembly 120 may substantially define the appearance of the memory device 10. The memory module 110 may be covered by the enclosure assembly 120 except for a part including an area where a memory connector MCN is located.

Referring to FIGS. 2 to 10, the memory module 110 may include a module board BDH, the memory connector MCN provided on at least one end of the module board BDH, and electronic elements CHP disposed on at least one surface of the module board BDH.

The module board BDH may include one or more insulating layers and one or more wiring layers. The module board BDH may include a printed circuit board.

The module board BDH may have a plate shape. The module board BDH may generally lie on the XY plane. The overall shape of the module board BDH may be similar to the shape of the memory device 10, in plan view. For example, when the memory device 10 has a rectangular appearance or an appearance similar thereto in plan view, the module board BDH may also have a rectangular appearance or an appearance similar thereto.

In plan view, the size of the module board BDH is smaller than the size of the memory device 10, but may be close thereto.

In plan view, the module board BDH may occupy a central portion of the memory device 10, and each side of the module board BDH may be located inside from a corresponding side of the memory device 10. The enclosure assembly 120 is disposed in a space between each side of the module board BDH and each side of the memory device 10 except for a certain part to prevent the exposure of the module board BDH to the outside.

The memory connector MCN may be disposed on one end of the module board BDH. In the drawings, the memory connector MCN is illustrated to be connected to a first short side SS1 of the module board BDH and to protrude outward from the module board BDH in the first direction X. However, embodiments are not limited thereto, and the memory connector MCN may be disposed on a different side or may be disposed on a plurality of sides.

The width of the memory connector MCN in the second direction Y may be smaller than the width of the module board BDH in the second direction Y. In addition, the memory connector MCN may be disposed to be spaced apart from the extension line of a first long side LS1 and/or from the extension line of a second long side LS2 of the module board BDH. The memory connector MCN may be generally disposed to be more adjacent to the second long side LS2 than the first long side LS1. That is, the distance between the memory connector MCN and the extension line of the first long side LS1 of the module board BDH may be greater than the distance between the memory connector MCN and the extension line of the second long side LS2 of the module board BDH. However, embodiments are not limited thereto and, in some embodiments, the memory connector MCN may be positioned at an equal distance from the long sides LS1, LS2 of the module board BDH.

The memory connector MCN is connected to the module board BDH. In some embodiments, the memory connector MCN may be provided as a separate member from the module board BDH and attached to the module board BDH, but embodiments are to limited thereto and, in some embodiments, the memory connector MCN may be provided integrally with the module board BDH. When the memory connector MCN is provided integrally with the module board BDH, the memory connector MCN may be provided in a protruding area of the module board BDH, which is a part of the module board BDH protruding outward.

The memory connector MCN may include connection terminals 160 (see FIG. 3). The connection terminals 160 may be arranged to be spaced apart along the second direction Y. The connection terminals 160 of the memory connector MCN may be connected to connector pins 220 (see FIG. 9) of a host connector 200 corresponding thereto. The connection between the memory connector MCN and the host connector 200 will be described later in detail.

Each of the connection terminals 160 includes a first region 161 and a second region 162, as illustrated in FIG. 7.

The first region 161 may include an insulator, and the insulator may be, for example, either a non-metal or a polymer.

The second region 162 may include a conductor, and the conductor may be a metal including, for example, cobalt (Co), tungsten (W), and/or copper (Cu).

In some embodiments, the first region 161 and the second region 162 may be adhered to each other using adhesive material. The adhesive material may be predetermined. In addition, in some embodiments, the first region 161 and the second region 162 may be integrally formed using a die casting method in which a conductor and an insulator are injected into a mold having the shape of the first region 161 and the second region 162.

In some embodiments, a length c of the first region 161 may be greater than a length d of the second region 162.

Further, in some embodiments, a ratio of the length c of the first region 161 to the length d of the second region 162 may be, for example, 3:2 to 4:1. As such, when the ratio of the length c of the first region 161 to the length d of the second region 162 is 3:2 to 4:1, the signal integrity may be improved while maintaining the reliability of the electrical connection between the connector pin 220 of the host connector 200 and the connection terminal 160 of the memory connector MCN. This will be described later.

In addition, in some embodiments, a ratio of the length c of the first region 161 to the total length c+d of the connection terminal 160 may be, for example, 0.64 to 0.77. A detailed description thereof will also be made later.

The connection terminals 160 of the memory connector MCN may be connected to a wiring of the module board BDH. When the memory connector MCN is provided integrally with the module board BDH, the connection terminals 160 of the memory connector MCN may be formed on the same layer using the same material as the wiring of the module board BDH. The connection terminals 160 may have a shape of a pad electrode of which the width is greater than that of the wiring of the module board BDH. The connection terminals 160 may be exposed to the outside of the memory device 10. In other words, at least part of each connection terminal 160 may be exposed without being covered by the one or more insulating layers of the module board BDH. The connection terminals 160 may be disposed on the top surface or the bottom surface of the memory connector MCN. In some cases, the connection terminals 160 may be disposed on both the top and bottom surfaces of the memory connector MCN. Further, the memory connector MCN may include a plurality of layers separated in the thickness direction, and the connection terminals 160 may be disposed on at least one surface of each layer.

The arrangement of the connection terminals 160 and the size, shape, position, and the like of the memory connector MCN described above may follow a standard. The standard may be predetermined. For example, the arrangement of the connection terminals 160 and the size, shape, position, and the like of the memory connector MCN may correspond to a standard such as E1.S, M.2, NF2, or the like.

The electronic elements CHP may be disposed on the top surface and/or bottom surface of the module board BDH. The electronic elements CHP may be manufactured in a form of a separate chip from the module board BDH and mounted on the module board BDH.

The electronic element CHP may include a semiconductor element. The semiconductor element may include a memory such as a NAND flash memory or a DRAM memory, and a memory controller that controls the memory. The electronic element CHP may further include a capacitor element. Each of the electronic elements CHP may be connected to the wiring of the module board BDH to perform an electrical operation. The plurality of electronic elements CHP may be spaced apart from each other.

Referring to FIGS. 2 to 10, the enclosure assembly 120 generally has a rectangular parallelepiped shape with an empty inside. The memory module 110 is accommodated in the enclosure assembly 120. The enclosure assembly 120 may serve as a housing.

In a position corresponding to a side surface of the memory device 10, the enclosure assembly 120 may include a connector opening COP exposing the memory connector MCN in the first direction X.

The enclosure assembly 120 may be provided by assembling a plurality of components. Specifically, the enclosure assembly 120 may include a first enclosure 121 positioned on the upper portion of the enclosure assembly 120 and a second enclosure 122 positioned on the lower portion of the enclosure assembly 120. The first enclosure 121 and the second enclosure 122 may be coupled to each other to define an at least partially sealed space. The memory module 110 may be accommodated in the at least partially sealed space.

The first enclosure 121 and the second enclosure 122 may each be made of a metal such as stainless steel, aluminum (Al), copper (Cu), titanium (Ti), nickel (Ni), or an alloy containing stainless steel, aluminum (Al), copper (Cu), titanium (Ti), and/or nickel (Ni), or made of a polymer material, a carbon-based material, or a composite material in which the polymer material and the carbon-based material are mixed.

The materials of the first enclosure 121 and the second enclosure 122 may be the same or different.

Each of the first enclosure 121 and the second enclosure 122 may include a portion contributing to a bottom cover corresponding to a bottom surface of the enclosure assembly 120.

The first enclosure 121 may further include at least one clamping hole CLH penetrating a first main cover CVU. The clamping hole CLH provides a space into which a hook 211 (see FIGS. 8-9) of the host connector 200 is inserted when the first enclosure 121 is connected to the host connector 200. The at least one clamping hole CLH may be disposed adjacent to the first short side SS1 of the module board BDH.

The clamping hole CLH may be disposed in the first main cover CVU at a position overlapping the memory connector MCN. The clamping hole CLH may have a rectangular shape having long sides in the second direction Y in plan view.

The number of clamping holes CLH may correspond to the number of hooks 211 of the host connector 200. When the host connector 200 includes two hooks 211, the number of clamping holes CLH may also be two. However, embodiments are not limited thereto and, in some embodiments, one hook 211 and one clamping hole CLH may be provided or more than three of each of the hooks 211 and the clamping holes CLH may be provided.

Referring to FIGS. 2 to 10, the memory device 10 may have a sealed structure in which the memory module 110 is completely enclosed by the first enclosure 121 and the second enclosure 122 except for a side on which the memory connector MCN is disposed.

The side of the memory device 10 on which the memory connector MCN is disposed may be substantially sealed by the host connector 200 to be described later.

Hereinafter, the structure of the host connector 200 will be described.

FIG. 8 is a perspective view of a host connector of a host of an electronic device according to some embodiments. FIG. 9 is a cross-sectional view of the host connector of FIG. 8. FIG. 10 is an enlarged view of a connector pin of the host connector of FIG. 9.

Referring to FIGS. 1 and 8 to 10, the host 20 may include the host connector 200 and a system board SBD.

The system board SBD may include a printed circuit board (PCB). The host connector 200 may be fixed to the system board SBD. In the drawings, the host connector 200 is illustrated to be fixed to the system board SBD through screws, but the fixing method thereof is not limited to the illustrated example. The host connector 200 and the system board SBD may be electrically connected to each other.

The host connector 200 may include a connector body HB, the connector pins 220 installed in the connector body HB, and a latch 210 installed on the top surface of the connector body HB.

A connector hole COH for accommodating the memory connector MCN is disposed in the connector body HB.

The width of the connector hole COH in the horizontal direction (i.e., the Y direction) is greater than or equal to the width of the memory connector MCN of the memory device 10 in the horizontal direction (i.e., the Y direction) to provide a space that can accommodate the memory connector MCN. The connector pins 220 may be disposed inside the connector hole COH of the host 20. When the memory connector MCN of the memory device 10 is inserted into the connector hole COH, the connection terminals 160 of the memory connector MCN are electrically connected to the connector pins 220 of the host connector 200, so that the memory device 10 and the host 20 may be interconnected. For complete airtightness, at least a part of or the whole of the side surface of the memory connector MCN inserted in the connector hole COH may contact the inner wall of the connector hole COH, but embodiments are not limited thereto.

The connector pin 220 may include a conductor. The conductor may include, for example, copper, tungsten, or the like.

The latch 210 may include a latch body 210_BD and one or more hooks 211 disposed at the end of the latch body 210_BD. The number and size of the hooks 211 may correspond to the number and size of the clamping holes CLH of the memory device 10.

The latch 210 may be coupled to the connector body HB by a joint 212. The joint 212 may include a spring. Since the spring has a restoring force, even if the latch 210 is lifted up by an external force, when the external force is removed, the spring may return to its original position.

Figure 11:
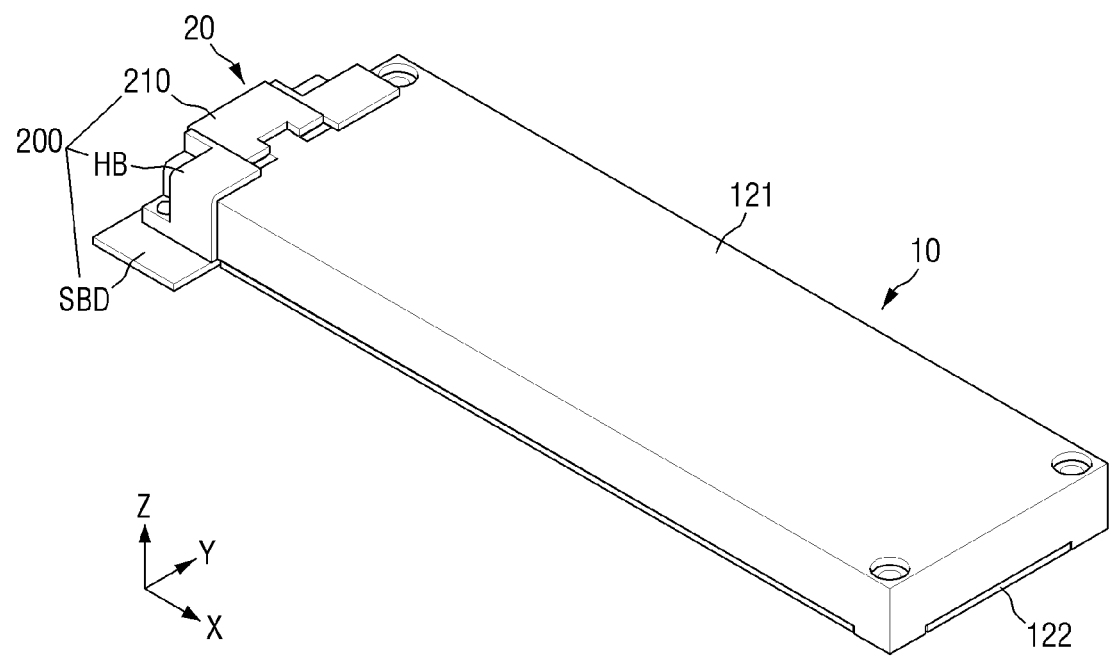
FIG. 11 is a perspective view illustrating a state in which a memory device is coupled to a host.
Figure 12:
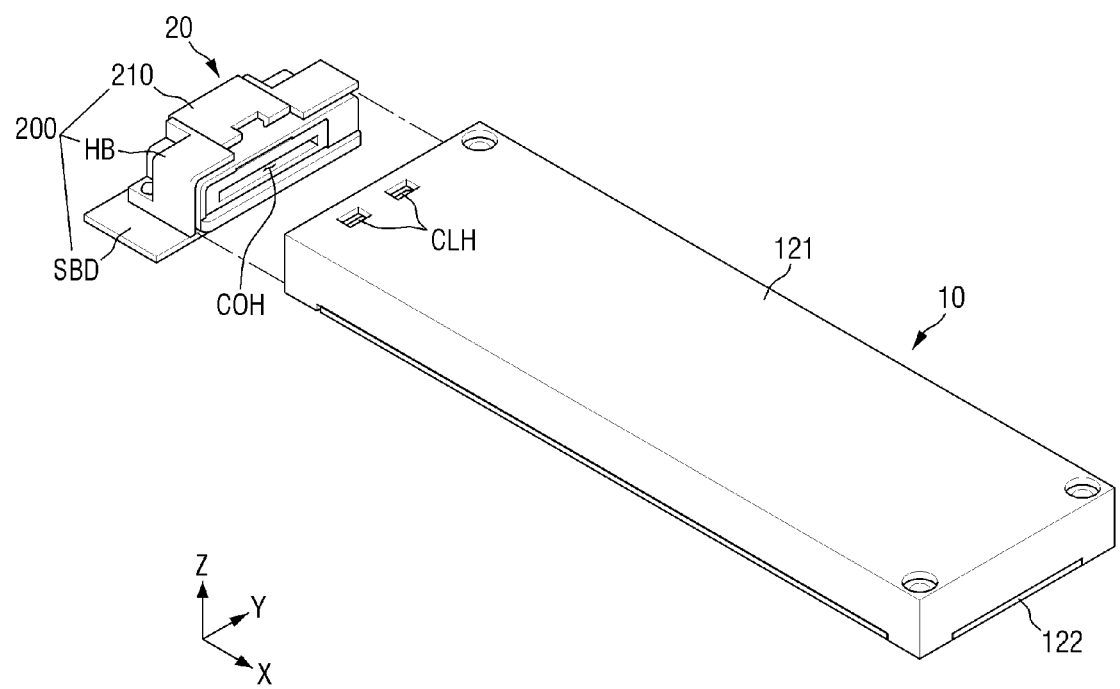
FIG. 12 is a perspective view illustrating a state before a memory device is coupled to a host.
Figure 13:
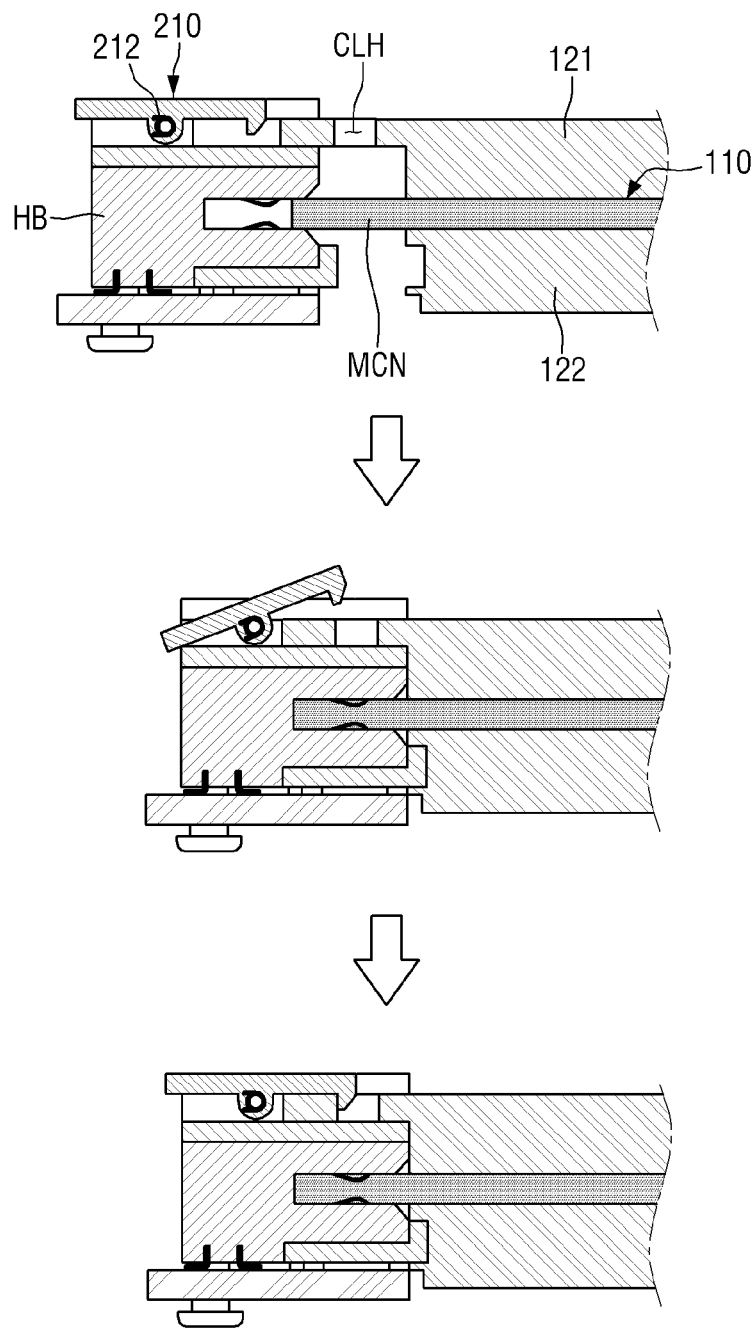
FIG. 13 shows cross-sectional views illustrating a process of coupling a memory connector to a host connector.
Figure 14:
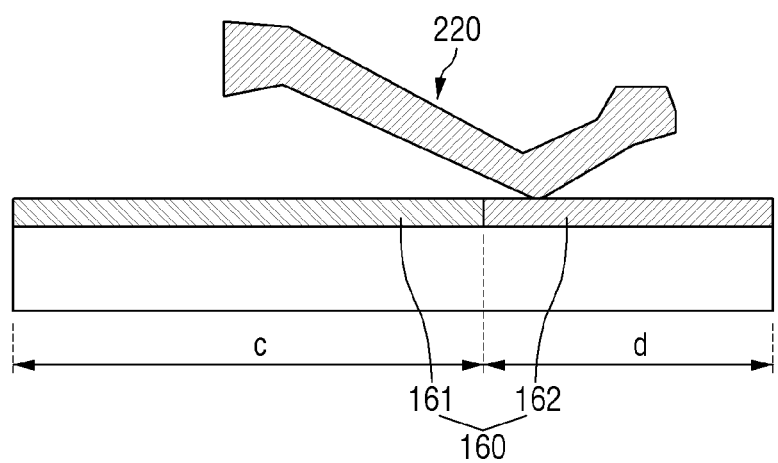
FIG. 14 is a view showing a connection form between a connector pin and a connection terminal, according to some embodiments.
Figure 15:
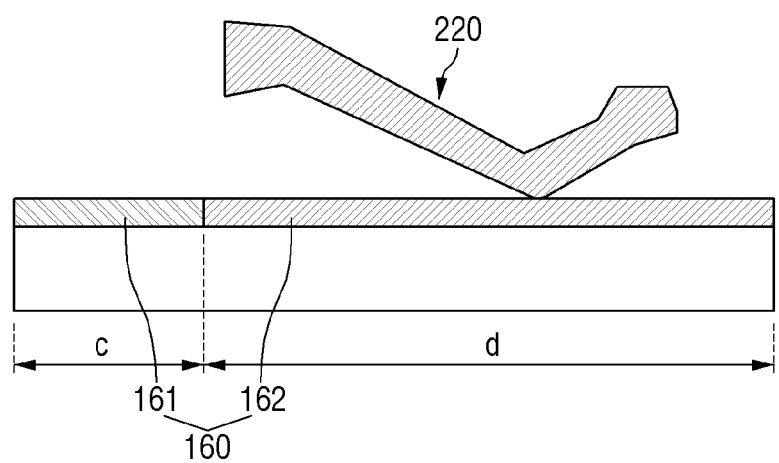
FIGS. 15 and 16 are views describing effects of a memory device according to some embodiments.
Figure 16:
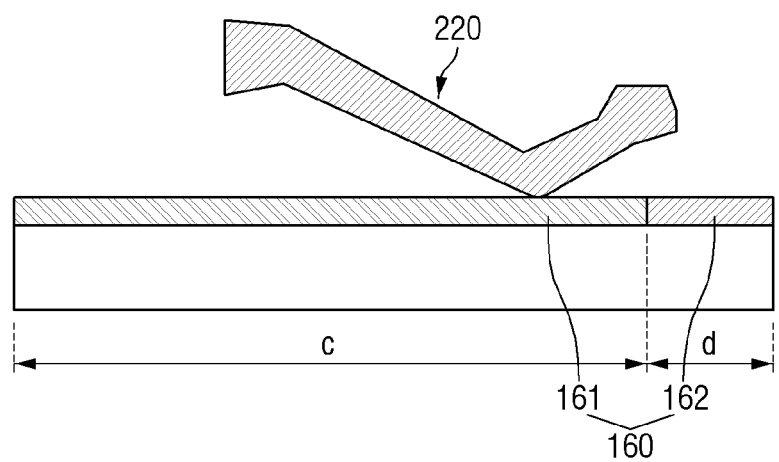

FIG. 11 is a perspective view illustrating a state in which a memory device is coupled to a host. FIG. 12 is a perspective view illustrating a state before a memory device is coupled to a host. FIG. 13 shows cross-sectional views illustrating a process of coupling a memory connector to a host connector. FIG. 14 is a view showing a connection form between a connector pin and a connection terminal, according to some embodiments. FIGS. 15 and 16 are views describing effects of a memory device according to some embodiments.

Referring to FIGS. 9 and 11 to 14, before the host 20 is coupled to the memory device 10, the latch 210 of the host connector 200 is in a state in which the latch body 210_BD lies parallel to an XY plane and the hook 211 faces downward. As the memory device 10 is pushed into the host connector 200, a leading edge of the first enclosure 121 pushes the hook 211 upward. As the memory device 10 is further pushed into the host connector 200, the bottom part of the hook 211 slides along the first enclosure 121 and into the clamping hole CLH. With respect to the inserted memory device 10, the hook 211 is positioned lower than the first main cover CVU of the first enclosure 121 (see FIG. 13).

The memory device 10 is pushed into the front of the host connector 200 to couple the memory device 10 to the host connector 200. At this time, the memory connector MCN is inserted into the connector hole COH. Through such a coupling process, the connector pins 220 are electrically connected to the connection terminals 160.

As described above, according to various embodiments by making the ratio of the length c of the first region 161 to the length d of the second region 162 in the connection terminal 160 be, for example, 3:2 to 4:1, the signal integrity may be improved while maintaining the reliability of the electrical connection between the connector pin 220 and the connection terminal 160.

For example, as shown in FIG. 15, if the ratio of the length c of the first region 161 to the length d of the second region 162 in the connection terminal 160 is, for example, 1:4 instead of 3:2, the electrical connection between the connector pin 220 and the connection terminal 160 may be good. However, since the length of the first region 161 made of an insulator is too short, the effect of improving the signal integrity may be reduced.

Alternatively, as shown in FIG. 16, if the ratio of the length c of the first region 161 to the length d of the second region 162 in the connection terminal 160 is, for another example, 5:1 instead of 4:1, the connector pin 220 may contact the first region 161, which is made of an insulator, of the connection terminal 160, so that the connector pin 220 and the connection terminal 160 may not be electrically connected to each other.

According to various embodiments, by maintaining the ratio of the length c of the first region 161 to the total length c+d of the connection terminal 160 at, for example, 0.64 to 0.77, the signal integrity may be improved while maintaining the reliability of the electrical connection between the connector pin 220 and the connection terminal 160.

Hereinafter, an electronic device according to some other embodiments will be described with reference to FIGS. 17 to 20.

Figure 17:
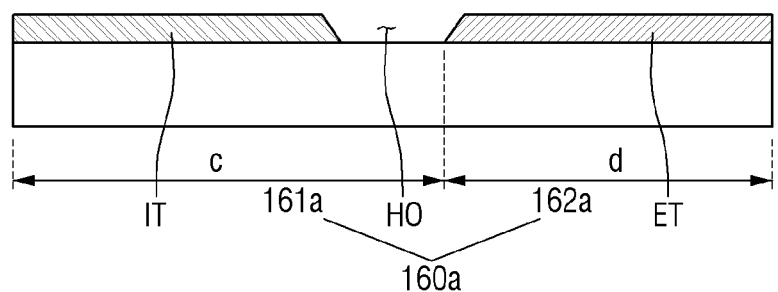
FIG. 17 is an enlarged view of a connection terminal of a memory connector, according to some embodiments.
Figure 18:
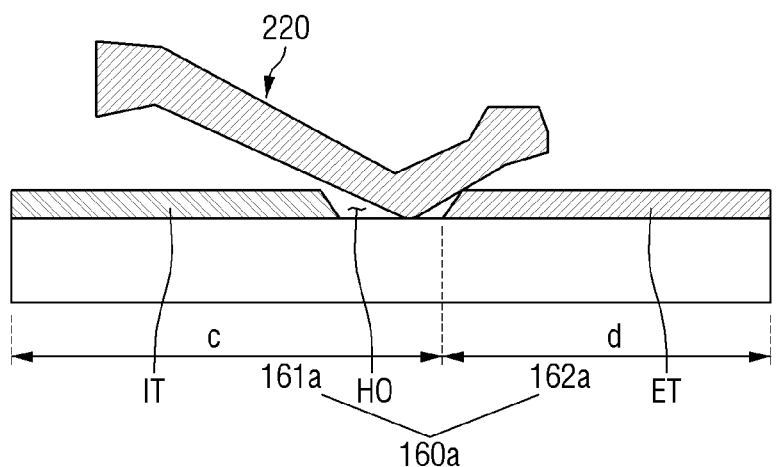
FIG. 18 is a view showing a connection form between a connector pin and the connection terminal of FIG. 17.

FIG. 17 is an enlarged view of a connection terminal of a memory connector, according to some embodiments. FIG. 18 is a view showing a connection form between a connector pin and the connection terminal of FIG. 17. Hereinafter, a repeated description of the same configuration as in the above-described embodiments will be omitted for conciseness, and differences will be mainly described.

Referring to FIG. 17, a connection terminal 160a includes a first region 161a and a second region 162a.

The first region 161a includes an insulating terminal IT including an insulator, and a groove HO. The second region 162a may include a conductive terminal ET including a conductor. The groove HO may be formed between the insulating terminal IT and the conductive terminal ET.

The conductor of the conductive terminal ET may be a metal including, for example, cobalt (Co), tungsten (W), and/or copper (Cu).

The insulator of the insulating terminal IT may be, for example, either a non-metal or a polymer.

In some embodiments, a ratio of the length c of the first region 161a to the length d of the second region 162a may be, for example, 3:2 to 4:1. In addition, in some embodiments, a ratio of the length c of the first region 161a to the total length c+d of the connection terminal 160a may be, for example, 0.64 to 0.77.

Referring to FIG. 18, the connector pin 220 may be electrically connected to the connection terminal 160a. Specifically, when the connector pin 220 is electrically connected to the connection terminal 160a, as shown in FIG. 18, the connector pin 220 may be spatially separated from the insulating terminal IT, and electrically connected to the conductive terminal ET.

Also in the embodiment illustrated in FIGS. 17-18, by making the ratio of the length c of the first region 161a to the length d of the second region 162a in the connection terminal 160a be, for example, 3:2 to 4:1, the signal integrity may be improved while maintaining the reliability of the electrical connection between the connector pin 220 and the connection terminal 160a. This has been sufficiently described above, and redundant descriptions will be omitted for conciseness.

Hereinafter, an electronic device according to some other embodiments will be described with reference to FIGS. 19 to 21.

Figure 19:
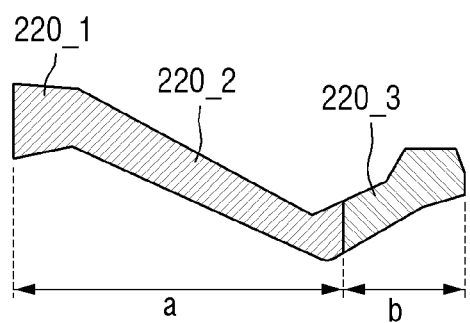
FIG. 19 is an enlarged view of a connector pin of a host connector, according to some embodiments.

FIG. 19 is an enlarged view of a connector pin of a host connector, according to some embodiments. FIG. 20 is an enlarged view of a connection terminal of a memory connector, according to some embodiments. FIG. 21 is a view showing a connection form between the connector pin of FIG. 19 and the connection terminal of FIG. 20, according to some embodiments.

Referring to FIG. 19, a connector pin 220a includes a first conductor part 220_1, a second conductor part 220_2, and a stub 220_3.

The first conductor part 220_1 includes a conductor. The second conductor part 220_2 includes a conductor, and is bent from the first conductor part 220_1 in a direction closer to a connection terminal 160b. The stub 220_3 is bent from the second conductor part 220_2 in a direction away from the connection terminal 160b (see FIGS. 20 and 21) and includes an insulator.

The conductor may be a metal including, for example, cobalt (Co), tungsten (W), and/or copper (Cu).

The insulator may be, for example, either a non-metal or a polymer.

In some embodiments, the second conductor part 220_2 and the stub 220_3 may be adhered to each other using an adhesive material. The adhesive material may be predetermined. Alternatively, in some embodiments, the second conductor part 220_2 and the stub 220_3 may be formed integrally using a die casting method in which a conductor and an insulator are injected into a mold having the shape of the second conductor part 220_2 and the stub 220_3.

In some embodiments, a sum a of the lengths of the first and second conductor parts 220_1 and 220_2 may be greater than a length b of the stub 220_3.

In addition, in some embodiments, a ratio of the sum a of the lengths of the first and second conductor parts 220_1 and 220_2 to the length b of the stub 220_3 may be 4:1.

Figure 20:
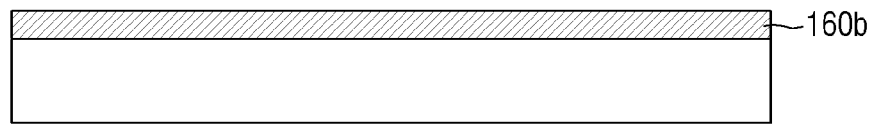
FIG. 20 is an enlarged view of a connection terminal of a memory connector, according to some embodiments.
Figure 21:
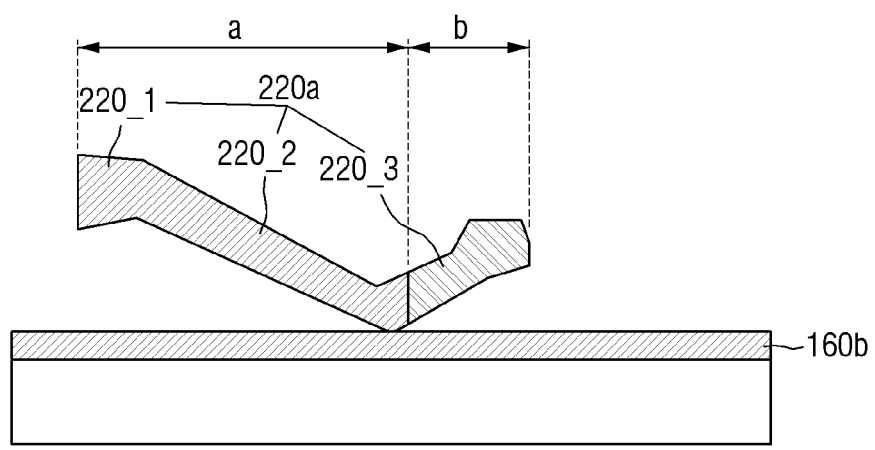
FIG. 21 is a view showing a connection form between the connector pin of FIG. 19 and the connection terminal of FIG. 20, according to some embodiments.

Referring to FIG. 20, unlike the embodiments illustrated in FIGS. 1-18, the connection terminal 160*b* according to the embodiment illustrated in FIGS. 19-21 may have no area including an insulator. That is, the entire connection terminal 160*b* may include a conductor. The conductor may be a metal including, for example, cobalt (Co), tungsten (W), and/or copper (Cu).

Referring to FIG. 21, the connector pin 220*a* may be electrically connected to the connection terminal 160*b*. Specifically, the second conductor part 220_2 of the connector pin 220*a* may be electrically connected to the connection terminal 160*b*. Through this connection, the first conductor part 220_1 may also be electrically connected to the connection terminal 160*b*.

In the embodiment illustrated in FIGS. 19-21, as described above, by making the ratio of the sum a of the lengths of the first and second conductor parts 220_1 and 220_2 to the length b of the stub 220_3 be 4:1, the signal integrity may be improved while maintaining the reliability of the electrical connection between the connection terminal 160*b* and the connector pin 220*a*.

Specifically, if the ratio of the sum a of the lengths of the first and second conductor parts 220_1 and 220_2 to the length b of the stub 220_3 is, for example, 3:2 instead of 4:1, the proportion of an area occupied by the stub 220_3 in the connector pin 220*a* is too large, so that the conductor of the connector pin 220*a* may not be electrically connected to the connection terminal 160*b*.

Alternatively, if the ratio of the sum a of the lengths of the first and second conductor parts 220_1 and 220_2 to the length b of the stub 220_3 is, for example, 5:1 instead of 4:1, the proportion of an area occupied by the stub 220_3 in the connector pin 220*a* is too small, so that the effect of improving the signal integrity may be reduced.

Hereinafter, an electronic device according to some other embodiments will be described with reference to FIGS. 22 and 23.

Figure 22:
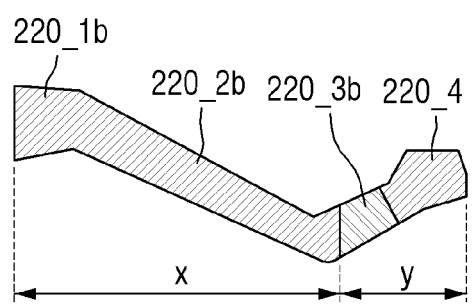
FIG. 22 is an enlarged view of a connector pin of a host connector, according to some embodiments.

FIG. 22 is an enlarged view of a connector pin of a host connector, according to some embodiments. FIG. 23 is a view showing a connection form between the connector pin of FIG. 22 and a connection terminal, according to some embodiments. Hereinafter, a description of the same configuration as in the above-described embodiments will be omitted for conciseness, and differences will be mainly described.

Figure 23:
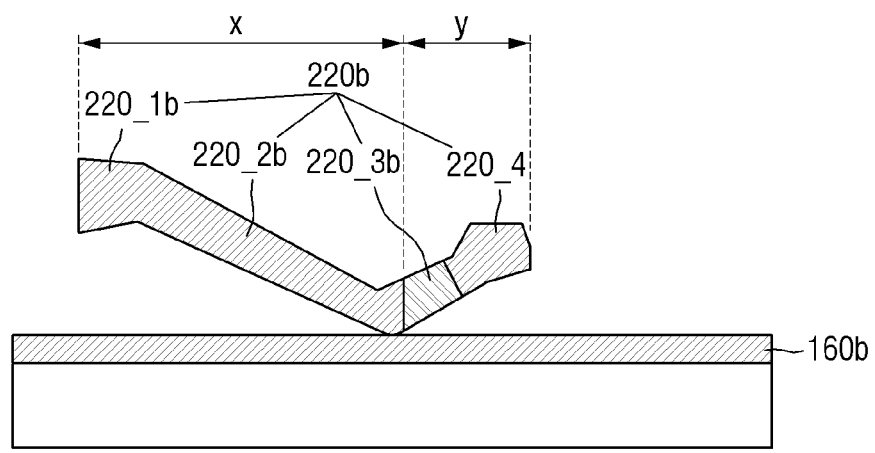
FIG. 23 is a view showing a connection form between the connector pin of FIG. 22 and a connection terminal, according to some embodiments.

Referring to FIGS. 22 and 23, a connector pin 220*b* includes a first conductor part 220_1*b*, a second conductor part 220_2*b*, a stub 220_3*b*, and a third conductor part 220_4.

The first conductor part 220_1*b* includes a conductor. The second conductor part 220_2*b* includes a conductor, and is bent from the first conductor part 220_1*b* in a direction closer to the connection terminal 160*b*. The stub 220_3*b* is bent from the second conductor part 220_2*b* in a direction away from the connection terminal 160*b* (see FIG. 23), and includes an insulator. The third conductor part 220_4 is bent from the stub 220_3*b* in a direction away from the connection terminal 160*b*, and includes a conductor.

The conductor may be a metal including, for example, cobalt (Co), tungsten (W), and/or copper (Cu).

The insulator may be, for example, either a non-metal or a polymer.

In some embodiments, the second conductor part 220_2*b*, the stub 220_3*b*, and the third conductor part 220_4 may be adhered to each other using an adhesive material. The adhesive material may be predetermined. Alternatively, in some embodiments, the second conductor part 220_2*b*, the stub 220_3*b*, and the third conductor part 220_4 may be formed integrally using a die casting method in which a conductor and an insulator are injected into a mold having the shape of the second conductor part 220_2, the stub 220_3*b*, and the third conductor part 220_4.

In some embodiments, the sum x of the lengths of the first and second conductor parts 220_1*b* and 220_2*b* may be greater than the sum y of the lengths of the stub 220_3*b* and the third conductor part 220_4.

In addition, in some embodiments, a ratio of the sum x of the lengths of the first and second conductor parts 220_1*b* and 220_2*b* to the sum y of the lengths of the stub 220_3*b* and the third conductor part 220_4 may be 4:1.

Referring to FIG. 23, as described above, by making the ratio of the sum x of the lengths of the first and second conductor parts 220_1*b* and 220_2*b* to the sum y of the lengths of the stub 220_3*b* and the third conductor part 220_4 be 4:1, the signal integrity may be improved while maintaining the reliability of the electrical connection between the connection terminal 160*b* and the connector pin 220*b*. This has been described above with reference to FIG. 21, and redundant descriptions will be omitted for conciseness.

Hereinafter, an electronic device according to some other embodiments will be described with reference to FIG. 24.

Figure 24:
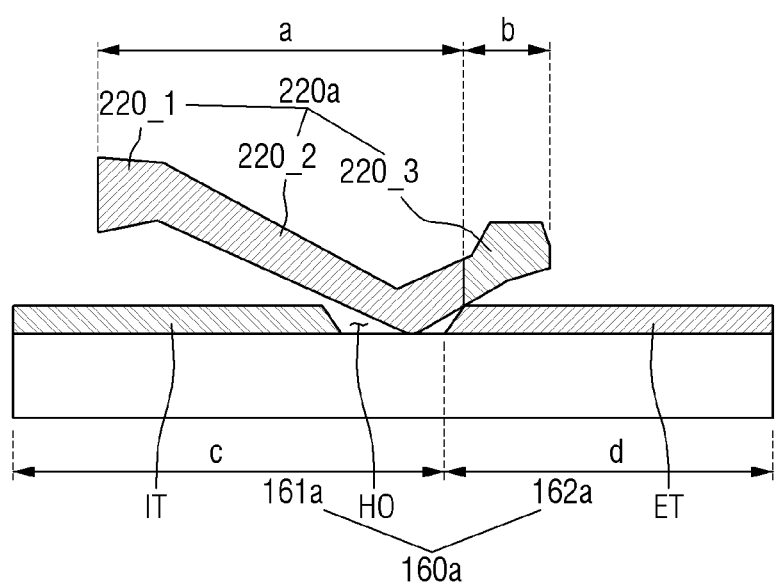
FIG. 24 is a view showing a connection form between a connector pin and a connection terminal.

FIG. 24 is a view showing a connection form between a connector pin and a connection terminal, according to some embodiments. Hereinafter, a description of the same configuration as in the above-described embodiments will be omitted for conciseness, and differences will be mainly described.

When the connector pin 220*a* according to the embodiment illustrated in FIG. 24 is electrically connected to the connection terminal 160*a*, the connector pin 220*a* is spatially separated from the insulating terminal IT and electrically connected to the conductive terminal ET.

In some embodiments, by making the ratio of the sum a of the lengths of the first and second conductor parts 220_1 and 220_2 to the length b of the stub 220_3 in the connector pin 220*a* be 4:1, the signal integrity may be improved while maintaining the reliability of the electrical connection between the connection terminal 160*b* and the connector pin 220*a*. This has been sufficiently described above, and redundant descriptions will be omitted for conciseness.

Also, in some embodiments, by making the ratio of the length c of the first region 161*a* to the length d of the second region 162*a* in the connection terminal 160*a* be, for example, 3:2 to 4:1, the signal integrity may be improved while maintaining the reliability of the electrical connection between the connector pin 220 and the connection terminal 160a. This has been sufficiently described above, and redundant descriptions will be omitted for conciseness.

In addition, in some embodiments, the ratio of the length c of the first region 161a to the total length c+d of the connection terminal 160a may be, for example, 0.64 to 0.77.

As described above, in a case where the ratio of the sum a of the lengths of the first and second conductor parts 220_1 and 220_2 to the length b of the stub 220_3 in the connector pin 220a is 4:1, in a case where the ratio of the length c of the first region 161a to the length d of the second region 162a in the connection terminal 160a is 3:2 to 4:1, and/or in a case where the ratio of the length c of the first region 161a to the total length c+d of the connection terminal 160a is 0.64 to 0.77, the signal integrity may be improved while maintaining the reliability of the electrical connection between the connector pin 220a and the connection terminal 160a.

Hereinafter, an electronic device according to some other embodiments will be described with reference to FIG. 25.

Figure 25:
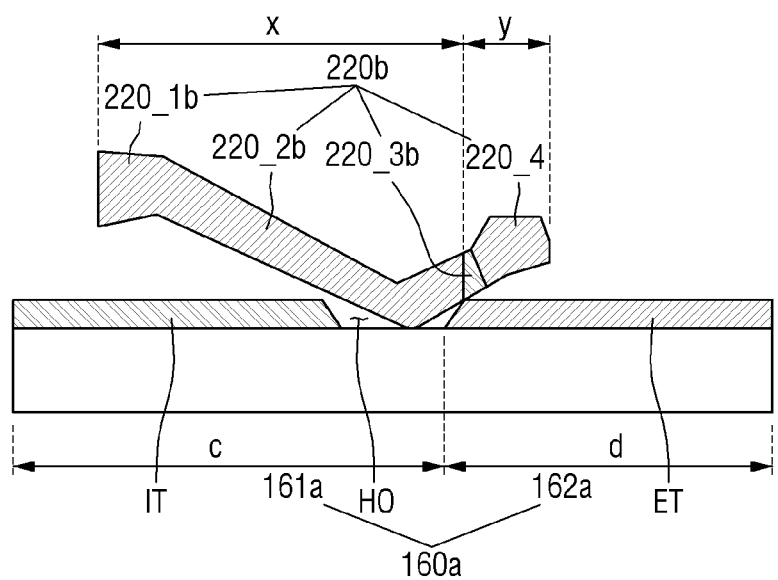
FIG. 25 is a view showing a connection form between a connector pin and a connection terminal.

FIG. 25 is a view showing a connection form between a connector pin and a connection terminal, according to some embodiments. Hereinafter, a description of the same configuration as in the above-described embodiments will be omitted for conciseness, and differences will be mainly described.

When the connector pin 220b is electrically connected to the connection terminal 160a, the connector pin 220b is spatially separated from the insulating terminal IT and electrically connected to the conductive terminal ET.

In some embodiments, by making the ratio of the sum x of the lengths of the first and second conductor parts 220_1b and 220_2b to the sum y of the lengths of the stub 220_3b and the third conductor part 220_4 in the connector pin 220b be 4:1, the signal integrity may be improved while maintaining the reliability of the electrical connection between the connection terminal 160a and the connector pin 220b.

As described above, in a case where the ratio of the sum x of the lengths of the first and second conductor parts 220_1b and 220_2b to the sum y of the lengths of the stub 220_3b and the third conductor part 220_4 in the connector pin 220b is 4:1, in a case where the ratio of the length c of the first region 161a to the length d of the second region 162a in the connection terminal 160a is 3:2 to 4:1, and/or in a case where the ratio of the length c of the first region 161a to the total length c+d of the connection terminal 160a is 0.64 to 0.77, the signal integrity may be improved while maintaining the reliability of the electrical connection between the connector pin 220b and the connection terminal 160a.

Those skilled in the art will appreciate that many variations and modifications can be made to the various embodiments described herein without substantially departing from the principles discussed above. Therefore, the disclosed embodiments are used in a generic and descriptive sense only and not for purposes of limitation.

What is claimed is:

1. A host connector comprising:
    a connector hole configured to accommodate a memory connector in which a connection terminal of a memory device is disposed; and
    a connector pin disposed in the connector hole, and electrically connected to the connection terminal of the memory connector when the memory connector is accommodated into the connector hole,
    wherein the connector pin includes:
    a first conductor part made of a conductor;
    a second conductor part made of the conductor, the second conductor part being bent from the first conductor part in a direction towards the connection terminal of the accommodated memory connector;
    a stub made of an insulator, the stub being bent from the second conductor part in a direction away from the connection terminal of the accommodated memory connector; and
    a third conductor part made of the conductor, the third conductor part being bent from the stub in the direction away from the connection terminal of the accommodated memory connector.

2. The host connector of claim 1, wherein a sum of a length of the first conductor part and a length of the second conductor part is greater than a length of the stub.

3. The host connector of claim 2, wherein a ratio of the sum to the length of the stub is 4:1.

4. The host connector of claim 1, wherein a ratio of a sum of a length of the first conductor part and a length of the second conductor part to a sum of a length of the stub and a length of the third conductor part is 4:1.

5. The host connector of claim 1, wherein the conductor is a metal, and the insulator is a non-metal or a polymer.

6. The host connector of claim 1, wherein the insulator of the stub and the conductor of the second conductor part are adhered to each other with an adhesive material.

7. A memory device comprising:
    a memory module including a module board and a memory connector disposed on one side of the module board, the memory connector having a connection terminal configured to be electrically connected to a host connector;
    a first enclosure disposed above the memory module; and
    a second enclosure disposed under the memory module,
    wherein the connection terminal includes:
    a first region made of an insulator; and
    a second region made of a conductor, and
    wherein when the memory connector is electrically connected to the host connector, the first region is adjacent to the host connector as compared to the second region, and
    wherein a length of the first region is greater than a length of the second region.

8. The memory device of claim 7, wherein a ratio of the length of the first region to the length of the second region is 3:2 to 4:1.

9. The memory device of claim 7, wherein the first region includes an insulating terminal made of the insulator, the second region includes a conductive terminal made of the conductor, and the first region includes a groove formed between the insulating terminal and the conductive terminal.

10. The memory device of claim 9, wherein when the memory connector is electrically connected to the host connector, a connector pin of the host connector is spatially separated from the insulating terminal and electrically connected to the conductive terminal.

11. The memory device of claim 9, wherein the conductor is a metal, and the insulator is a non-metal or a polymer.

12. The memory device of claim 7, wherein the insulator of the first region of the connection terminal is adhered to the conductor of the second region of the connection terminal with an adhesive material.

13. An electronic device comprising:
    a host connector including a connector pin; and
    a memory connector including a connection terminal electrically connected to the connector pin of the host connector, wherein the connector pin includes:
   a first conductor part made of a conductor;
   a second conductor part made of a conductor, the second conductor part being bent from the first conductor part in a direction towards the connection terminal; and
   a stub made of an insulator, the stub being disposed to extend from a distal end of the second conductor part and being bent from the second conductor part in a direction away from the connection terminal, and
wherein the connection terminal includes:
   a first region made of an insulator; and
   a second region made of a conductor, and
wherein the second conductor part is electrically connected to the second region, so that the host connector is electrically connected to the memory connector.

14. The electronic device of claim 13, wherein a ratio of a length of the first region of the connection terminal to a length of the connection terminal is from 0.64 to 0.77.

15. The electronic device of claim 13, wherein a ratio of a sum of a length of the first conductor part and a length of the second conductor part to a length of the stub is 4:1.

16. The electronic device of claim 13, wherein the connector pin further includes a third conductor part made of a conductor, the third conductor part being bent from the stub in the direction away from the connection terminal.

17. The electronic device of claim 13, wherein when the memory connector is electrically connected to the host connector, the connector pin of the host connector is spatially separated from the first region.

18. The electronic device of claim 13, wherein a ratio of a length of the first region to a length of the second region is 3:2 to 4:1.

* * * * *